US006949449B2

(12) United States Patent
Swenson et al.

(10) Patent No.: US 6,949,449 B2
(45) Date of Patent: Sep. 27, 2005

(54) METHOD OF FORMING A SCRIBE LINE ON A CERAMIC SUBSTRATE

(75) Inventors: Edward J. Swenson, Portland, OR (US); Yunlong Sun, Beaverton, OR (US); Manoj Kumar Sammi, Beaverton, OR (US); Jay Christopher Johnson, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 23 days.

(21) Appl. No.: 10/618,377

(22) Filed: Jul. 11, 2003

(65) Prior Publication Data

US 2005/0009235 A1 Jan. 13, 2005

(51) Int. Cl.[7] .............................................. H01L 21/301

(52) U.S. Cl. ........................ 438/463; 438/462; 438/460; 219/121.67

(58) Field of Search ................................ 438/460, 462, 438/463, 464, 940; 219/121.67

(56) References Cited

U.S. PATENT DOCUMENTS

| | | | | |
|---|---|---|---|---|
| 5,961,852 A | 10/1999 | Rafla-Yuan et al. | ..... | 219/21.69 |
| 6,117,347 A | 9/2000 | Ishida | ......................... | 216/52 |
| 6,140,603 A | 10/2000 | Hwang et al. | ......... | 219/121.69 |
| 6,413,839 B1 * | 7/2002 | Brown et al. | ............... | 438/463 |
| 6,420,245 B1 | 7/2002 | Manor | ........................ | 438/460 |
| 6,420,776 B1 | 7/2002 | Glenn et al. | ................ | 257/620 |
| 6,580,054 B1 * | 6/2003 | Liu et al. | ............... | 219/121.68 |
| 6,787,732 B1 | 9/2004 | Xuan et al. | ............ | 219/121.67 |
| 2002/0033558 A1 | 3/2002 | Fahey et al. | ................ | 264/400 |

FOREIGN PATENT DOCUMENTS

| | | | |
|---|---|---|---|
| WO | WO 02/24395 A1 | 3/2002 | ......... B23K/26/073 |
| WO | WO 02/060636 A1 | 8/2002 | ........... B23K/26/38 |
| WO | WO 03/002289 A1 | 1/2003 | ........... B23K/26/38 |

OTHER PUBLICATIONS

Park, Jongkook and Sercel, Patrick, "High–speed UV laser scribing boosts blue LED industry," Compoundsemiconductor.net magazine, posted on Dec. 2002 (available at www-.compoundsemiconductor.net/magazine/article/8/12/3/1) (last visited Jul. 10, 2003).

D. H. Schroeder and F. L. English, "A Comparison of the Strength of Alumina Substrates for Different Separation Techniques," from 1972 Components Conference Proceedings, Microcircuit Technology Division, pp. 412–415.

* cited by examiner

*Primary Examiner*—Amir Zarabian
*Assistant Examiner*—Christy Novacek
(74) *Attorney, Agent, or Firm*—Stoel Rives LLP

(57) ABSTRACT

A method of forming a scribe line having a sharp snap line entails directing a UV laser beam along a ceramic substrate such that a portion of the thickness of the ceramic substrate is removed. The UV laser beam forms a scribe line in the ceramic substrate in the absence of appreciable ceramic substrate melting so that a clearly defined snap line forms a region of high stress concentration extending into the thickness of the ceramic substrate. Consequently, multiple depthwise fractures propagate into the thickness of the ceramic substrate in the region of high stress concentration in response to a breakage force applied to either side of the scribe line to effect clean breakage of the ceramic substrate into separate circuit components. The formation of this region facilitates higher precision breakage of the ceramic substrate while maintaining the integrity of the interior structure of each component during and after application of the breakage force.

34 Claims, 5 Drawing Sheets

METHOD OF FORMING A SCRIBE LINE ON A CERAMIC SUBSTRATE

COPYRIGHT NOTICE

© 2003 Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR 1.71(d).

TECHNICAL FIELD

The present invention relates to a method of forming a scribe line in a ceramic substrate, and more particularly to a method of using an ultraviolet laser to ablate a ceramic substrate and thereby form a scribe line along which the ceramic substrate may be broken into multiple pieces.

BACKGROUND OF THE INVENTION

As is well known to those of skill in the art, passive and hybrid microelectronic circuit components (hereinafter circuit "components"), are fabricated in an array on or in the interior of a ceramic substrate. The ceramic substrate is cut, sometimes called diced, to singulate the circuit components from one another.

For the past 30 years, the predominant method of singulating ceramic substrates involved using a pulsed $CO_2$ laser dicing process in which a pulsed laser was aligned with and then directed along a street to form a "post hole" scribe line. FIG. 1 is a scanning electron micrograph (SEM) of a post hole scribe line 2 formed by pulsed $CO_2$ laser cutting. As shown in FIG. 1, post hole scribe line 2 includes spaced-apart shallow vias 4 that extend into the thickness of a ceramic substrate 6 along the length of scribe line 2. Following formation of the post hole scribe line, force is applied to the ceramic substrate portions on either side of the scribe line to effect breakage of the ceramic substrate into separate pieces.

Although pulsed $CO_2$ laser cutting offers advantages in speed, cleanliness, accuracy, and reduced kerf, the use of the post hole scribe line creates separate ceramic pieces having jagged and uneven side edges as well as significant melted slag residue. As shown in the SEM of FIG. 2, ceramic substrate piece 6 formed in accordance with the post hole scribe line method has sinusoidal-shaped side edges 8 rather than the preferred straight and smooth side edges. Further, ceramic substrate piece 6 includes slag residue 7.

Pulsed $CO_2$ laser cutting also leads to distortion of the interior structure of the ceramic surface, resulting in structurally weak components. Specifically, the strength of the ceramic substrate is reduced, decreasing its ability to withstand thermal or mechanical stress. The structural weakness of the interior often evidences itself in an increased number of microcracks present near the laser scribe line. FIGS. 3A and 3B are SEMs showing cross-sections of ceramic substrate pieces formed using pulsed $CO_2$ laser cutting. FIG. 3A shows a ceramic substrate piece at 10× magnification, and FIG. 3B shows the side edge of a ceramic substrate piece at 65× magnification. Both figures show multiple microcracks 9 extending from side edge 8 into the interior of the ceramic substrate piece 6. According to Weibull's strength theory, the flexural strength of the ceramic substrate decreases as the density of microcracks increases (Weibull, W., *Proc. Roy. Swedish Inst. Engrg. Research,* 193.151 (1939)). Manufacturing costs increased because many of the circuit components were discarded as a consequence of their insufficient flexural strength.

Until recently, fired ceramic substrates had length and width dimensions of about 6×8 inches and a thickness of about 1 mm. The uneven side edges, slag residue, and microcracks formed as a result of pulsed $CO_2$ laser cutting were tolerable when scribing ceramic substrates having these specifications.

However, recent technological advances in component miniaturization necessitate singulation of circuit components having length and width dimensions of about 1 mm×0.5 mm (0402) or 0.5 mm×0.25 mm (0201) and a thickness of between about 80 microns and about 300 microns. Circuit components of this density and/or thickness cannot tolerate such uneven side edges, slag residue, and microcracks resulting from either pulsed $CO_2$ or ND:YAG laser cutting because these methods of laser cutting adversely affect the specified circuit component values and/or subsequent component processing.

One prior art attempt to singulate these smaller and thinner circuit components entailed sawing through the ceramic substrate using a saw blade that had been aligned with a "street" created by the thick and thin film patterns formed on or in the interior of the ceramic substrate as part of the process of forming the circuit components. Alignment of the saw blade and street was achieved using an alignment system. Tape was preferably attached to the ceramic substrate before sawing to provide support for the singulated circuit components upon completion of sawing. Problems with this prior art method include inexact positioning and alignment of the saw blade, mechanical wobbling of the saw blade, and uneven or rough surfaces resulting from the mechanical nature of cutting with a saw blade. Further, the width of the scribe line had to be sufficiently large to accommodate the width of the saw blade. A typical saw blade is 75–150 microns wide along its cutting axis, producing cuts that are about 150 microns wide. Because the resulting scribe lines had relatively large widths and therefore occupied a greater portion of substrate surface, fewer components could be produced for any given size of ceramic substrate. This resulted in more wasted surface area, less surface area available for circuit component parts, and a greater than optimal cost of each circuit component.

The method by which most large-sized chip resistor components are formed involves initially precasting the scribe lines into a ceramic substrate in an unfired state. The resistor components are then printed on the fired ceramic substrate, and the substrate is broken along the scribe lines to form separate circuit components.

For smaller circuit components, a YAG laser is used to form the scribe lines in a fired ceramic substrate. These scribe lines are used to align subsequent printing steps. However, YAG laser scribing is slow and does not provide the desired vertical breaks. An ultraviolet (UV) YAG laser may replace the YAG laser, yielding much higher scribe speeds and better breaks. However, as circuit component size further decreases, use of this method became untenable because the circuit components were of such a small size that it became impossible to align the printing patterns to the previously formed scribe lines.

It consequently became necessary to form off-axis scribe lines. This need was also evident for ceramic components (chip capacitors, conductors, filters, etc.) that had been fired, a process that entails exposing the ceramic substrate to temperatures of between about 750° C. and about 1100° C. Prolonged exposure to these high temperatures causes the ceramic substrates to warp along one or both axis, resulting in the formation of a non-standard shaped ceramic substrate. Thus, a need arose for a laser that could align with and accurately scribe these nonstandard-shaped ceramic substrates to form multiple nominally identical circuit components. Those skilled in the art will understand that the printing and scribing sequence can be interchanged without affecting the end result.

Additionally, many circuit components have a top layer that includes metal. This layer can extend into either or both of the streets extending along the x-axis or the y-axis. Those of ordinary skill will readily recognize that the existence of metal in the top layer prevents the use of a $CO_2$ laser since the metal reflects the $CO_2$ laser beam. Further, mechanically sawing a metal-containing layer is undesirable because the ductile nature of many metals, such as copper, make mechanical sawing of a metal-containing layer an extremely slow and difficult process.

Via drilling using an UV YAG laser has been used extensively in the printed wiring board (PWB) industry. Specifically, a UV-YAG laser emits a laser beam that cuts through the top, metal-containing layer before the underlying organic material is drilled. Thus UV laser drilling of copper, and other metals used in the fabrication of circuit components, is well understood by those of ordinary skill in the art.

What is needed, therefore, is an economical method of forming a scribe line in a ceramic substrate that facilitates the clean breakage of the ceramic substrate into separate circuit component parts having clearly defined side margins, minimal slag residue, and a reduced incidence of microcracking.

SUMMARY OF THE INVENTION

An object of the present invention is, therefore, to provide a method by which a ceramic substrate, on a surface or in the interior of which have been formed multiple evenly spaced electronic components, may be cleanly singulated into separate circuit components, including, e.g., capacitors, filters, and resistors.

The method of the present invention entails directing an UV laser beam to form a scribe line along a thin ceramic substrate such that a portion of the thickness of the ceramic substrate is removed to form a shallow trench. The trench has a width that converges from the ceramic substrate surface to the bottom of the trench to define a sharp snap line. The UV laser emits a laser beam characterized by an energy and spot size sufficient to form a scribe line in the ceramic substrate in the absence of appreciable ceramic substrate melting so that the clearly defined, sharp snap line forms a region of high stress concentration extending into the thickness of the ceramic substrate and along the length of the snap line. Consequently, multiple depthwise fractures propagate into the thickness of the ceramic substrate in the region of high stress concentration in response to a breakage force applied to either side of the trench to effect clean breakage of the ceramic substrate into separate circuit components having side margins defined by the snap line.

The formation of a region of high stress concentration facilitates higher precision breakage of the ceramic substrate while maintaining the integrity of the interior structure of the ceramic substrate of each circuit component during and after application of the breakage force. This is so because the multiple depthwise fractures that form in the ceramic substrate as a result of the application of the breakage force propagate depthwise through the thickness of the ceramic substrate in the region of high stress concentration rather than lengthwise throughout the interior structure of each piece of ceramic substrate. Formation of depthwise fractures in this manner facilitates cleaner breakage of the ceramic substrate to form multiple nominally identical circuit components.

The laser beam cutting process results in minimal resolidification of the ceramic substrate material, thereby decreasing the degree to which the side walls of the trench melt during application of the laser beam to form slag residue. The lack of significant resolidification and consequent formation of clearly defined trench side walls results in higher precision breakage of the ceramic substrate along the length of the scribe line because the nature of the laser beam weakens the ceramic substrate without disturbing the interior structure of the ceramic substrate.

Additional aspects and advantages of this invention will be apparent from the following detailed description of a preferred embodiment thereof, which proceeds with reference to the accompanying drawings.

DETAILED DESCRIPTION OF A PREFERRED EMBODIMENT

Figure 1:
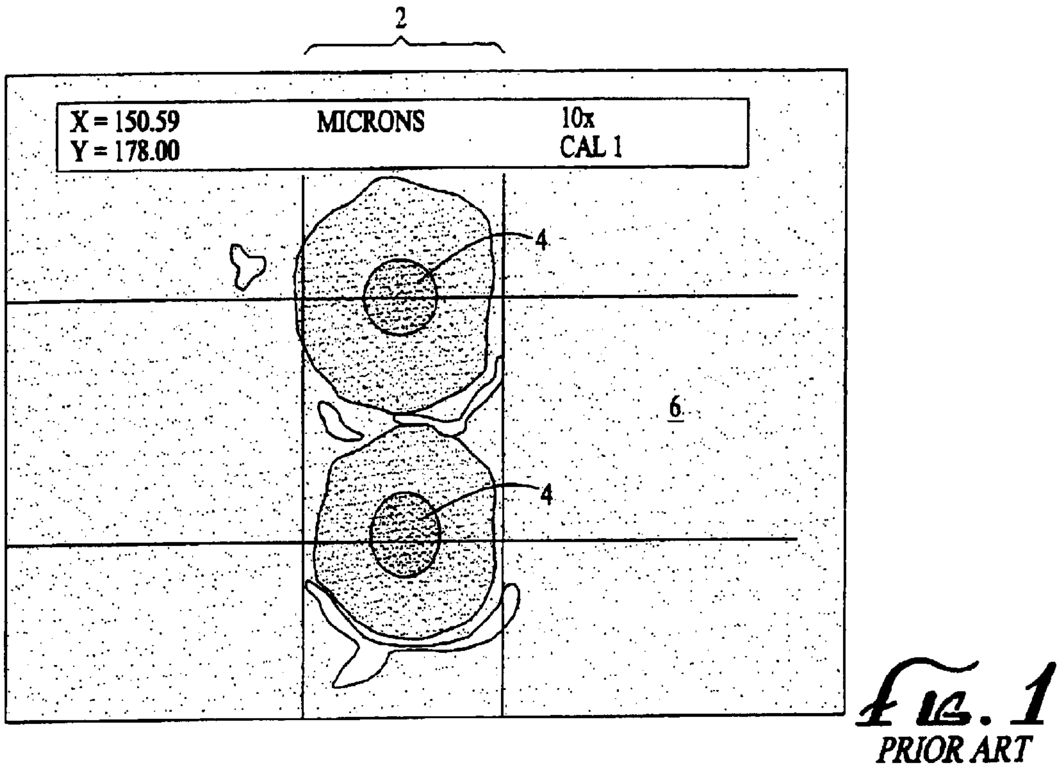
FIG. 1 is a scanning electron micrograph showing a top view of a post hole scribe line formed in a ceramic substrate using prior art $CO_2$ laser cutting.
Figure 2:
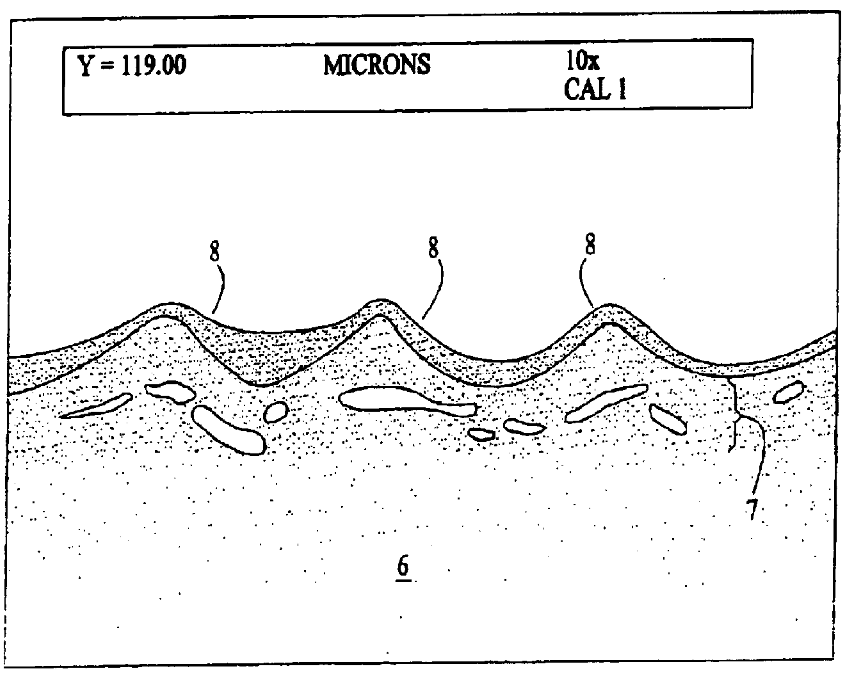
FIG. 2 is a scanning electron micrograph of a top view showing for a scribe line cut into a ceramic substrate the slag residue of a jagged and uneven ceramic substrate side edge that was formed upon application of a breakage force on opposing sides of the post hole scribe line shown in FIG. 1.
Figure 3A:
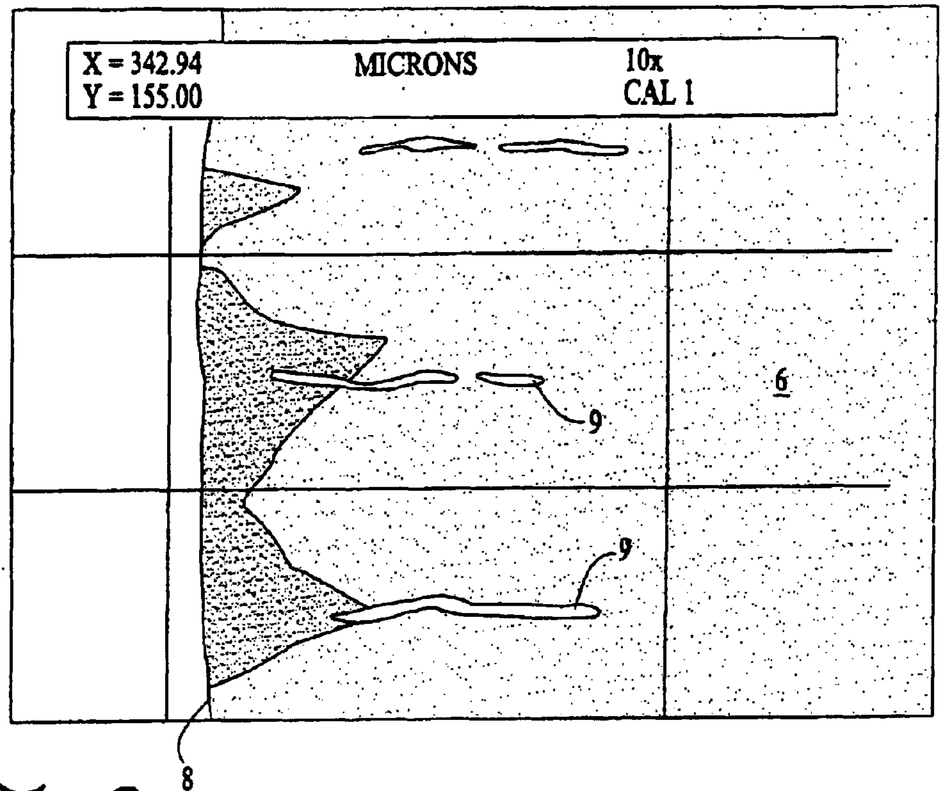
FIGS. 3A and 3B are scanning electron micrographs showing at, respectively, 10× magnification and 65× magnification, cross sections of ceramic substrate pieces having microcracks extending through the interior of the substrate piece and formed using prior art $CO_2$ laser cutting.
Figure 3B:
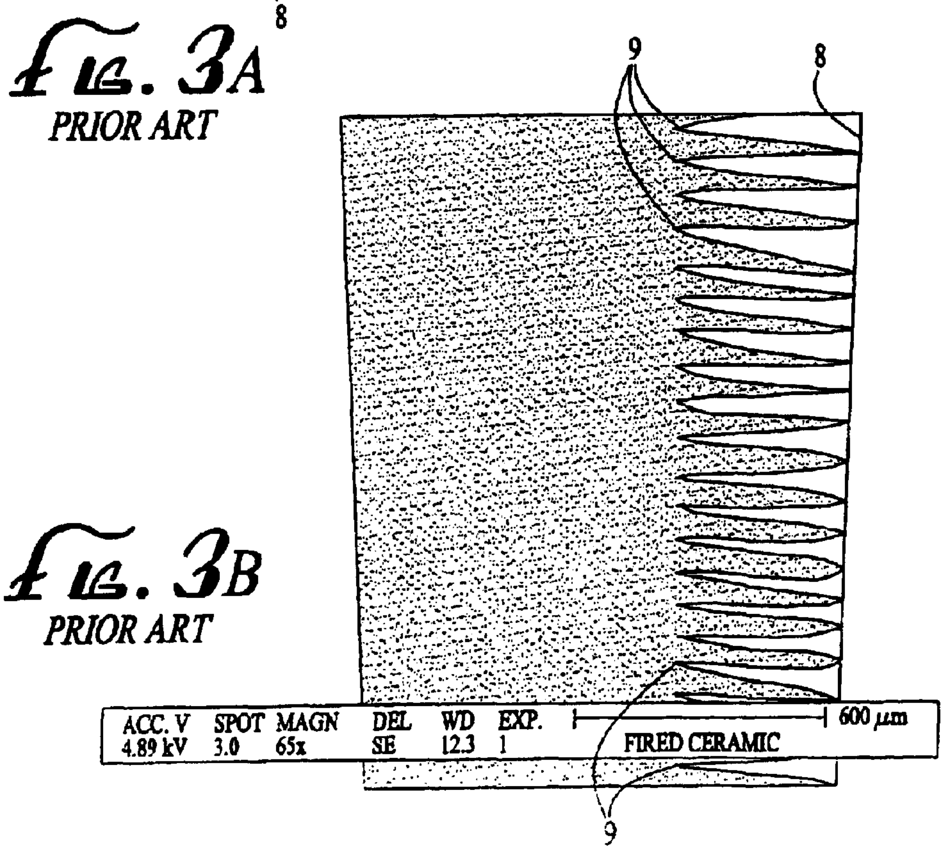

The present invention entails directing a laser beam emitted by a solid-state ultraviolet laser to form a scribe line on a ceramic substrate. The ceramic substrate absorbs the energy from the emitted laser beam, thereby effecting depthwise removal of a portion of the ceramic substrate to form a shallow trench along the streets created by patterns formed on a surface or in the interior of the ceramic substrate as part of the process of forming the circuit components. Depending on the type of circuit components being fabricated, the patterns are typically formed by thick film processing (e.g., by screen printing for thick film resistors or multi-layer chip capacitors (MLCCs)) or by thin film processing (e.g., by vacuum deposition). The shallow trench includes two side walls extending from the ceramic substrate surface and converging to form a clearly defined snap line at the bottom of the trench such that the trench has a cross section that is approximately triangular in shape (a wide opening and an apex). The depth of the trench is preferably sufficiently shallow such that the trench does not appreciably penetrate the thickness of the ceramic substrate, thereby minimizing the formation of microcracks in the ceramic substrate that extend perpendicular to the scribe line. Further, the laser beam preferably has a wavelength that is sufficient to minimize resolidification of the ceramic substrate along the sidewalls of the scribe line.

A preferred laser for use in the method of the present invention is a Q-switched, diode-pumped, solid-state UV laser that includes a solid-state lasant, such as Nd:YAG, Nd:YLF, Nd:YAP, or Nd:$YVO_4$, or a YAG crystal doped with holmium or erbium. (A UV laser is defined as one that emits light having a wavelength of less than 400 nm.) UV lasers are preferred because most ceramic substrates exhibit strong absorption in the UV range; however, any laser source that generates a laser beam having a wavelength that is strongly absorbed by a ceramic substrate may be used. A preferred laser provides harmonically generated UV laser output of one or more laser pulses at a wavelength such as 355 nm (frequency tripled Nd:YAG), 266 nm (frequency quadrupled Nd:YAG), or 213 nm (frequency quintupled Nd:YAG) with primarily a $TEM_{00}$ spatial mode profile. Laser output having a wavelength of 355 nm is especially preferred because the harmonic crystalline availability and intracavity doubling at this wavelength allows for the greatest available power and pulse repetition rate. The laser is preferably operated at a high repetition rate of between about 15 kHz and about 100 kHz and a power of between about 0.5 W and about 10 W. The pulse length is preferably about 30 ns, but can be any appropriate pulse length.

The UV laser pulses may be converted to expanded collimated pulses by a variety of well-known optical devices including beam expander or upcollimator lens components (with, for example, a 2× beam expansion factor) that are positioned along a laser beam path. A beam positioning system typically directs collimated pulses through an objective scan or cutting lens to a desired laser target position on the ceramic substrate.

The beam positioning system preferably includes a translation stage positioner and a fast positioner. The translation stage positioner employs at least two platforms or stages that support, for example, X, Y, and Z positioning mirrors, and permit quick movement between target positions on the same or different areas of the same or different ceramic substrates. In a preferred embodiment, the translation stage positioner is a split-axis system in which a Y stage, typically moved by linear motors, supports and moves the ceramic substrate, an X stage supports and moves the fast positioner and the objective lens, the Z dimension between the X and Y stages is adjustable, and fold mirrors align the beam path through any turns between the laser and fast positioner. The fast positioner may, for example, employ high resolution linear motors or a pair of galvanometer mirrors that can effect unique or duplicative processing operations based on provided test or design data. These positioners can be moved independently or coordinated to move together in response to panelized or unpanelized data.

The beam positioning systems incorporated in Model Series Nos. 43xx and 44xx small area micromachining systems manufactured by Electro Scientific Industries, Inc., Portland, Oreg., the assignee of this patent application, are suitable for implementing the present invention to scribe smaller (i.e., smaller than 10.2 cm×10.2 cm (4 in×4 in)) ceramic substrates. The beam positioning systems incorporated in Model Series Nos. 52xx and 53xx large area micromachining systems manufactured by Electro Scientific Industries, Inc. are suitable for implementing the present invention to scribe larger ceramic substrates (i.e., larger than 10.2 cm×10.2 cm (4 in×4 in)). Some of these systems, which use an X-Y linear motor for moving the workpiece and an X-Y stage for moving the scan lens, are cost effective positioning systems for making long, straight cuts. Skilled persons will also appreciate that a system with a single X-Y stage for workpiece positioning with a fixed beam position and/or stationary galvanometer for beam positioning may alternatively be employed.

The method of the present invention can be used in connection with multiple laser systems operating under various parameters. Because the operating parameters of each specific laser system work in cooperation to form the clearly defined scribe line, the operational parameters can be tailored to the laser system, the ceramic substrate, or the manufacturing constraints. For example, a thick substrate may be effectively scribed according to the method of the present invention using any, or a combination, of the following operational parameters: a high power laser, a high repetition rate, multiple passes, or high energy per pulse. Conversely, a thinner substrate may be effectively scribed according to the method of the present invention using any, or a combination, of the following operational parameters: a low power laser, a low repetition rate, a single pass, or low energy per pulse.

Figure 4:
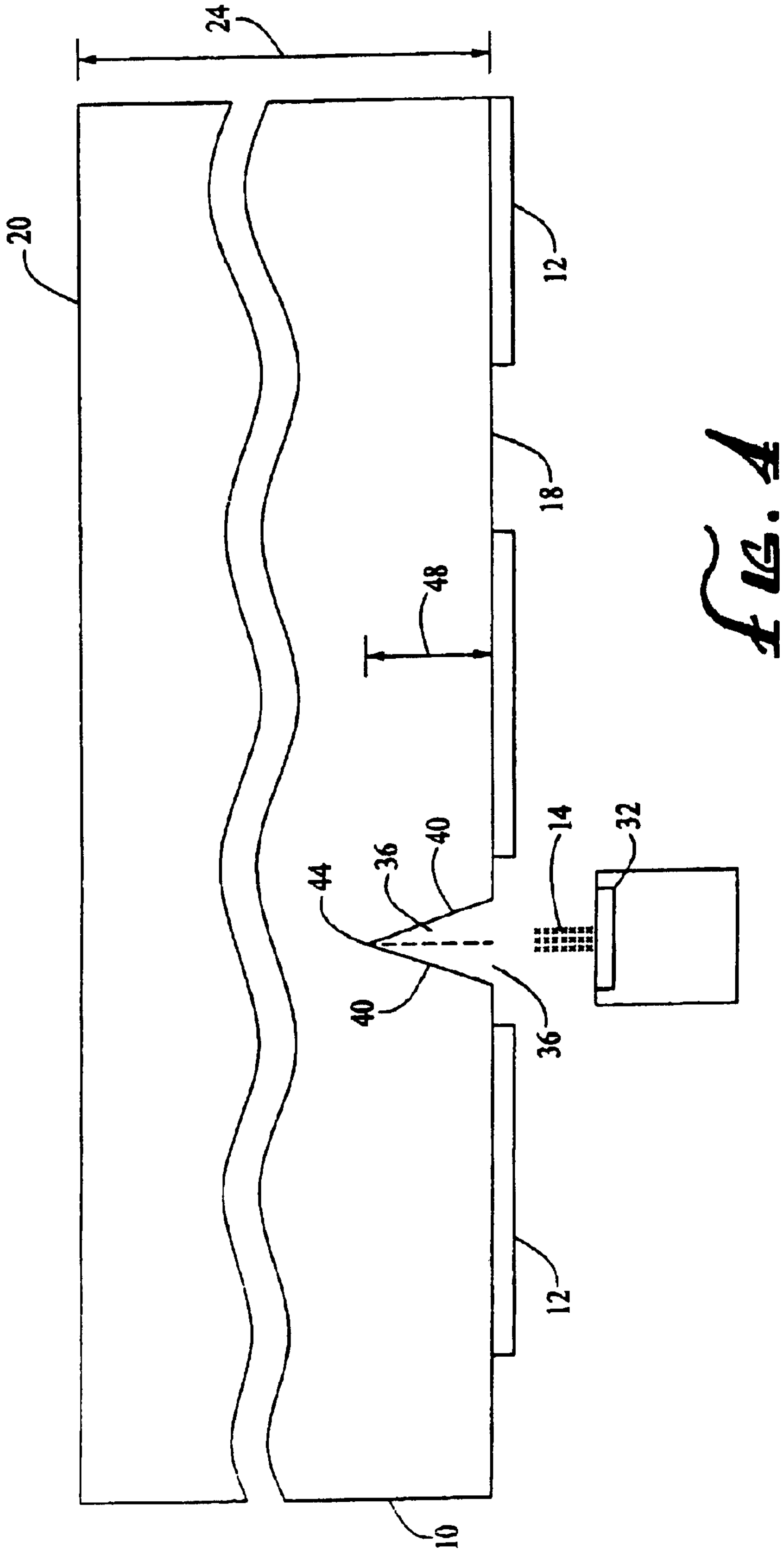
FIG. 4 is a pictorial schematic diagram of a laser scribe machine emitting a laser beam that impinges a ceramic substrate surface to form a scribe line in accordance with the present invention.

As shown in FIG. 4, a ceramic substrate 10 onto which a laser beam 14 is aimed includes a first surface 18 and a second surface 20 that define between them a substrate thickness 24. Ceramic substrate 10 also includes a street 28 (shown in FIG. 5) and multiple electronic components 12, e.g. resistors, that have been affixed on one of first substrate surface 18 or second substrate surface 20. The singulating method of the present invention can be performed on either side of ceramic substrate 10. Ceramic substrate 10 can optionally be masked in any of the ways, including tape masking, commonly known to those skilled in the art.

A laser scribe machine including a laser 32 is aligned with street 28 using a beam positioning system as described above. The portion of ceramic substrate 10 coextensive with street 28 is then ablated to form a shallow trench 36. Trench 36 may be formed by a single pass or multiple passes of laser beam 14, depending on the operational parameters of the laser system, the thickness, density, and type of ceramic substrate being scribed, and any manufacturing constraints. The length of trench 36 typically runs the entire usable length or width of the ceramic substrate surface. Trench 36 includes a trench length that is preferably coextensive with street 28 and a trench width that is preferably less than about 30 $\mu$m and more preferably between about 20 $\mu$m and about 30 $\mu$m, as established by the laser beam spot size.

Figure 5:
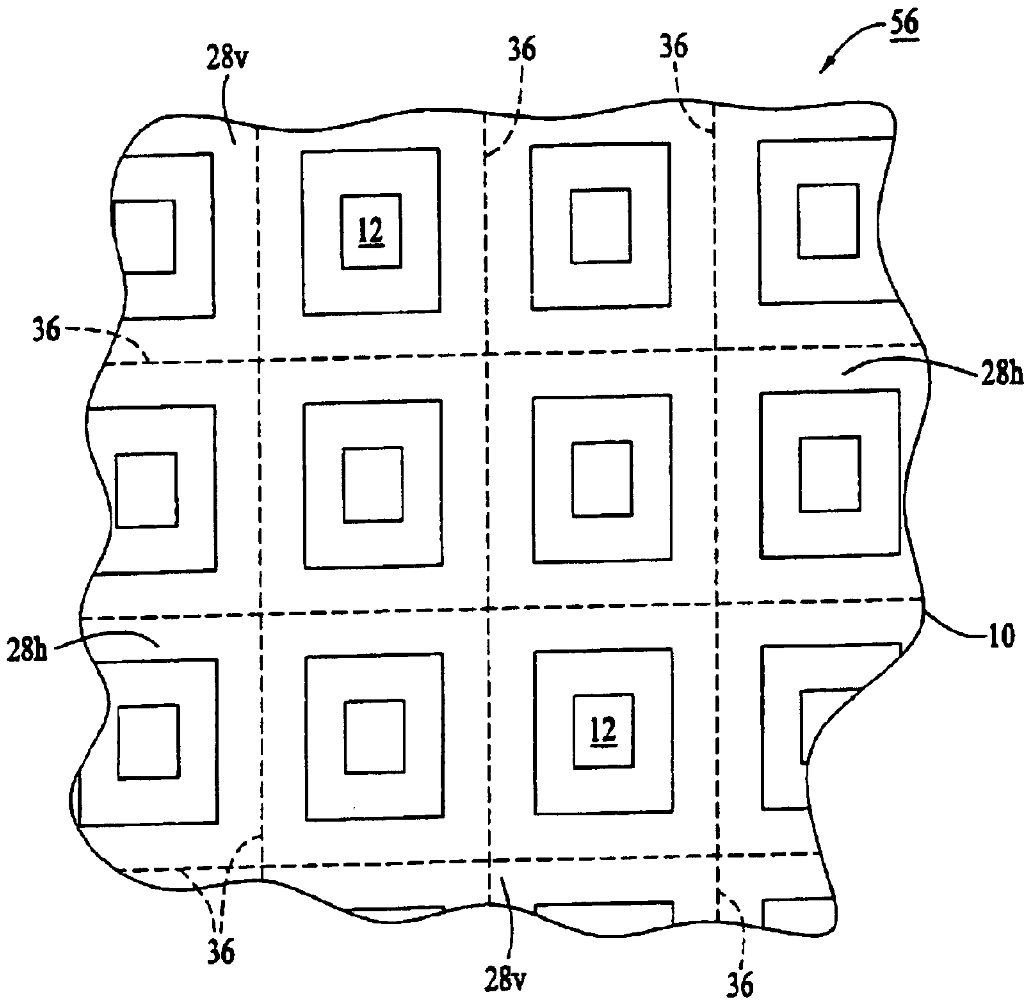
FIG. 5 is a top view of a scribe grid composed of multiple streets on the surface of a ceramic substrate onto which have been affixed multiple electronic components, such as resistors, along which the scribe line may be formed in accordance with the present invention.

Multiple trenches may be created along streets 28 to form a grid on the ceramic substrate surface as shown in FIG. 5. The multiple trenches may be formed in any of the ways commonly known to those skilled in the art, including scribing one scribe line with multiple passes before scribing additional scribe lines, scribing each scribe line in the grid with a first pass before scribing each line with additional passes, and scribing using an alternate pattern approach. (An example of alternate pattern scribing would be, for a set of multiple streets arranged side-by-side lengthwise, forming scribe lines in alternating sequence along streets from two nonoverlapping subsets of the streets in the set.) Because ceramic substrates retain heat, the preferred method of scribing grids having a tight pitch (grids in which adjacent scribe lines are positioned less than 400 microns apart) involves scribing, in an alternate pattern, each individual scribe line with a first pass before scribing each line with additional passes. The time elapsed between the first and second passes for each scribe line facilitates heat dissipation and thereby minimizes the incidence of heat build-up-based chipping and cracking of the ceramic substrate.

Trench 36 further includes two inclined side walls 40 extending from the ceramic substrate surface 18 and converging to form a clearly defined snap line 44 at the bottom of trench 36 such that it has a cross section that is approximately triangular in shape (a wide opening and an apex 44). In FIG. 4, trench 36 has a trench depth 48 extending from either first surface 18 (FIG. 4) or second surface 20 of ceramic substrate 10 to the bottom of trench 36 where the two side walls 40 converge to form snap line 44 having a high stress concentration. Trench depth 48 is preferably sufficiently shallow such that trench 36 does not appreciably penetrate ceramic substrate thickness 24, thereby minimizing the formation of microcracks extending perpendicular to the scribe line. Trench depth 48 is dependent on the circuit size and substrate thickness and is preferably between about 5% and 25% of the substrate thickness. Trench depth 48 can be controlled by selecting the appropriate power setting and duration of application for laser beam 14.

The ceramic substrate is then singulated into multiple pieces by application of a tensile breakage force perpendicular to the scribe line. Trench 36 is preferably triangle-shaped such that the application of a breakage force on both sides of trench 36 causes ceramic substrate 10 to cleanly break along snap line 44. The resulting multiple circuit components include side margins portions of which were originally trench side walls 40.

A plurality of trenches 36 may be formed on ceramic substrate 10 using the method of the present invention. One exemplary method by which a plurality of circuit components can be made is shown in FIG. 5, showing a scribe grid 56 on a surface of ceramic substrate 10. Scribe grid 56 includes horizontal (x-axis) 28h and vertical (y-axis) 28v streets that define an array of separate regions, each corresponding to an individual circuit component.

Instead of, or in addition to, covering with a sacrificial layer the ceramic substrate surface that will be impinged by laser beam 14, as is well known to persons skilled in the art, laser cutting may be performed from the backside 20 of the ceramic surface so that laser-generated debris becomes irrelevant. Backside alignment can be accomplished with laser or other markings or through-holes made from front side 18 of ceramic substrate 10. Alternatively, backside alignment can be accomplished using edge alignment and/or calibration with a camera view, as are known to persons skilled in the art.

The following examples demonstrate exemplary lasers and operational parameters that cooperate to effect the depthwise removal of ceramic substrate material to form the clearly defined, shallow snap line of the present invention.

EXAMPLE 1

Lower Power, Higher Repetition Rate Micromachining

A scribe line was formed on a ceramic substrate material having a thickness of 0.913 mm using a Model No. V03 laser, manufactured by LightWave Electronics of Mountain View, Calif., emitting a 25 micron Gaussian beam and positioned in a Model No. 5200 laser system, manufactured by Electro Scientific Industries. The process was run at an effective rate of 0.5 mm/s (actual rate=25 mm/s/repetitions). The operational parameters used are listed in Table I.

TABLE I

| Operational Parameters. | |
|---|---|
| PRF | 3 kHz |
| Avg. Power | 1.4 W |
| Min. Power | 1.4 W |
| Max. Power | 1.4 W |
| Wavelength | 355 nm |
| Stability* | 100% |
| Energy/Pulse | 466.7 uJ |
| Fluence | 95 J/cm$^2$ |
| Speed | 25 mm/s |
| Bite Size | 8.33 microns |
| Spot Diameter | 25 microns |
| No. of Repetitions+ | 1 to 50 |

*stability is a measure of pulse-to-pulse laser stability.
+Repetitions are the number of passes the laser beam makes over a specific area.

Following formation of the scribe line, the ceramic material was broken along the line to form two singulated circuit components that were examined with a light microscope to evaluate cut quality, depth, and features. The circuit component side edges were clean and had no debris. The walls of the cut were slightly tapered due to the Gaussian beam profile. Overall, the process produced a clean cut having good edges and a clean break. Data relating to the depth of the cut vs. the number of repetitions and the percentage of cut (cut/total thickness of the fired ceramic material) are shown in Table II, which suggests that multiple repetitions are preferred when using these operational parameters.

TABLE II

Test Results for Depth of Cut, Percent Cut, and Depth per Pass

| Pass | Depth of Cut (mm) | Percent Cut | Depth per Pass (mm) |
|---|---|---|---|
| 4 | 0.014 | 1.53% | 0.014 |
| 5 | 0.017 | 1.86% | 0.003 |
| 6 | 0.023 | 2.52% | 0.006 |
| 7 | 0.029 | 3.18% | 0.006 |
| 8 | 0.029 | 3.18% | 0 |
| 9 | 0.031 | 3.40% | 0.002 |
| 10 | 0.032 | 3.50% | 0.001 |
| 11 | 0.038 | 4.16% | 0.006 |
| 12 | 0.038 | 4.16% | 0 |
| 13 | 0.046 | 5.04% | 0.008 |
| 25 | 0.08 | 8.76% | 0.034 |
| 50 | 0.165 | 18.07% | 0.085 |

EXAMPLE 2

Higher Power, Lower Repetition Rate Micromachining

A scribe line was formed on a ceramic substrate material having a thickness of 0.962 mm using a Model No. Q301 laser, manufactured by LightWave electronics of Mountain View, Calif., emitting a 25 micron Gaussian beam and positioned in a Model No. 5200 laser system, manufactured by Electro Scientific Industries. The operational parameters used are listed in Table III.

TABLE III

| Operational Parameters | |
|---|---|
| PRF | 15 kHz |
| Avg. Power | 7.27 W |
| Min. Power | 7.25 W |
| Max. Power | 7.29 W |
| Wavelength | 355 nm |
| Stability* | 99.3% |
| Energy/Pulse | 484.7 uJ |
| Fluence | 98.7 J/cm$^2$ |

*Stability is a measure of pulse-to-pulse laser stability.

Three separate trials were performed at varying speeds and bite sizes as indicated in Tables IV, V, and VI.

TABLE IV

| Trial #1 | |
|---|---|
| Speed | 25 mm/s |
| Bite Size | 1.667 microns |
| Spot Diameter | 25 microns |
| No. of Repetitions | 1 to 2 |
| Effective Speed | 12.5 mm/s |

TABLE V

| Trial #2 | |
|---|---|
| Speed | 50 mm/s |
| Bite Size | 3.33 microns |
| Spot Diameter | 25 microns |
| No. of Repetitions | 2 |
| Effective Speed | 25 mm/s |

TABLE VI

| Trial #3 | |
|---|---|
| Speed | 100 mm/s |
| Bite Size | 6.66 microns |
| Spot Diameter | 25 microns |
| No. of Repetitions | 3 |
| Effective Speed | 33 mm/s |

Following formation of each scribe line, the ceramic material was broken along the line to form two singulated circuit components that were examined with a light microscope to evaluate cut quality, depth, and features. The edge break areas on the scribed circuit components formed by lasers scribing at speeds of 50 mm/s and 100 mm/s produced very clean edges along the snap line. An edge taper of approximately 20 microns was seen on the edges, which may be attributed to a scribe line width of approximately 45 microns.

Data regarding the depth of cut vs. the number of repetitions (passes) for each of the three trials described in Tables IV to VI are shown in Table VII.

TABLE VII

Depth of Cut per Repetition for Lasers Operating at Speeds of 25 mm/s, 50 mm/s, and 100 mm/s.

| Pass | Depth of Cut (mm) | Percent Cut | Depth per Pass (mm) |
|---|---|---|---|
| 25 mm/s | | | |
| 1 | 0.019 | 1.98% | 0.019 |
| 2 | 0.027 | 2.81% | 0.008 |
| 3 | 0.038 | 3.95% | 0.011 |
| 50 mm/s | | | |
| 1 | 0.014 | 1.46% | 0.014 |
| 2 | 0.017 | 1.77% | 0.003 |
| 3 | 0.023 | 2.39% | 0.006 |
| 100 mm/s | | | |
| 1 | 0.01 | 1.04% | 0.01 |
| 2 | 0.021 | 2.18% | 0.011 |

A comparison of Tables II and VII shows that the increased power used in Example 2 results in an increased ceramic material removal rate. Consequently, a higher power per pulse laser system operating at a higher repetition rate is preferred.

EXAMPLE 3

Higher Power, Lower Repetition Rate Micromachining

A scribe line was formed on a ceramic substrate material having a thickness of approximately 100 microns using a Model No. Q302 laser, manufactured by LightWave Electronics of Mountain View, Calif., emitting a 25 micron Gaussian beam and positioned in a Model No. 5200 laser system, manufactured by Electro Scientific Industries. The operational parameters used are listed in Table VIII.

TABLE VIII

Operational Parameters

| Wave-length (nm) | Avg. Power (W) | Repetition Rate (kHz) | Energy/Pulse (μJ) | No. of Repetitions | Pulse Width (ns) | Max. Power (kw) | Effective Spot Diameter (μm) | Fluence (J/cm$^2$) |
|---|---|---|---|---|---|---|---|---|
| 355 | 3.9 | 50 | 78 | 1 | 25 | 3.12 | 30 | 1.10 |

The laser beam was moved at a programmed speed of 100 mm/s and an effective speed of 50 mm/s. The stability of the laser system was approximately 100%, and the total depth of the scribe line was approximately 28 microns. Because the bite size was approximately 2 microns, there was significant overlap in each of two passes. Following formation of the scribe line, the ceramic material was broken along the line to form two singulated circuit components that were examined with a light microscope to evaluate cut quality, depth, and features. The edge break areas on the scribed circuit components lacked significant slag residue.

Examples 1–3 show that the formation of a region of high stress concentration facilitates higher precision breakage of the ceramic substrate such that the interior integrity of each resulting ceramic substrate piece remains substantially unchanged during and after application of the breakage force. The ceramic substrate interior remains intact because the multiple depthwise fractures that form in the ceramic substrate as a result of the application of the breakage force propagate depthwise through the thickness of the ceramic substrate in the region of high stress concentration rather than lengthwise throughout the interior structure of each piece of ceramic substrate. This facilitates cleaner breakage of the ceramic substrate into multiple circuit components.

Figure 6:
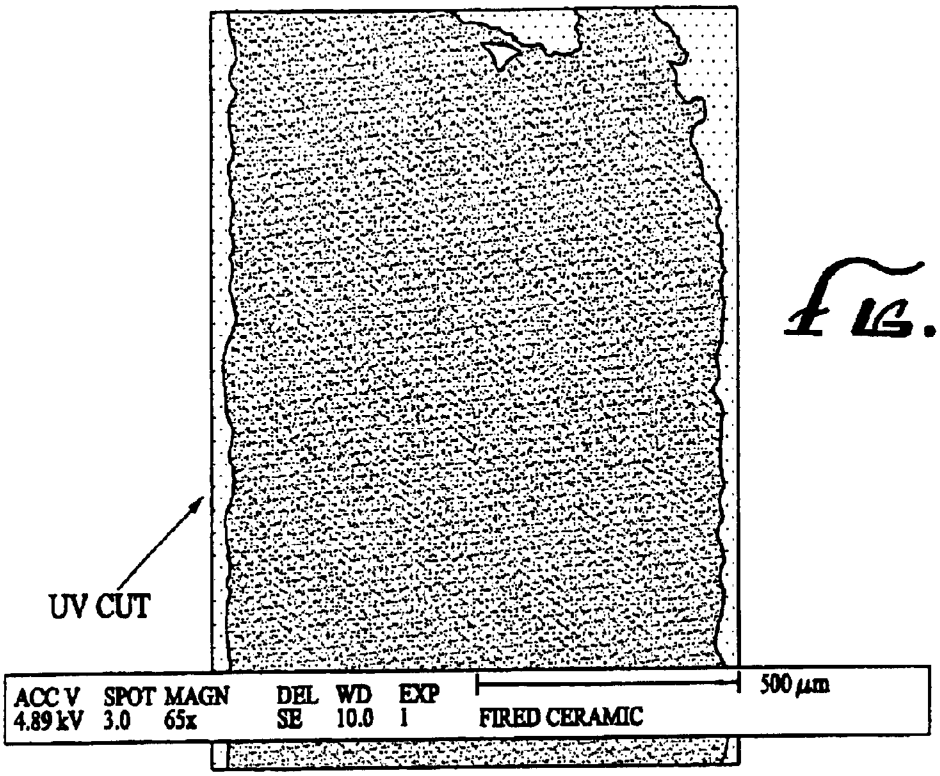
FIG. 6 is a scanning electron micrograph showing at 65× magnification the smooth and even side edges of a ceramic substrate piece scribed in accordance with the present invention.

Also, the operating parameters of the laser beam minimize the incidence of resolidification of the ceramic substrate material, decreasing the degree to which the side walls of the trench melt during application of the laser beam and thereby minimizing the formation of slag residue. Specifically, the laser scribe method of the present invention causes absorption of most of the laser energy by the portion of the ceramic substrate thickness removed by the laser pulse. Such energy absorption ensures that virtually no heat is left behind to cause melting of the sidewalls of the trench. The lack of significant resolidification and consequent clearly defined trench side walls results in higher precision breakage of the ceramic substrate along the scribe line because the ablative (non-thermal) nature of the laser beam weakens the ceramic substrate without disturbing the interior structure of the ceramic substrate. The minimal resolidification also results in superior and consistent edge quality; the smoother edges eliminate points of weakness from which microcracks may originate. FIG. 6 is an SEM showing at 65× magnification the smooth and even side edges of a ceramic substrate piece that was scribed in accordance with the method of the present invention.

Laser cutting also consumes significantly less material (kerfs of less than 50 $\mu$m wide and preferably less than 30 $\mu$m wide) than does mechanical cutting (slicing lanes of about 300 $\mu$m and dicing paths of about 150 $\mu$m) so that more circuit components can be manufactured on a single ceramic substrate.

The method of the present invention also facilitates scribing a ceramic substrate having an irregular shape that required off-axis alignment of the substrate and the laser beam. Specifically, the method of the present invention can be used to form off-axis scribe lines positioned at azimuthal angles relative to the normal.

Figure 7:
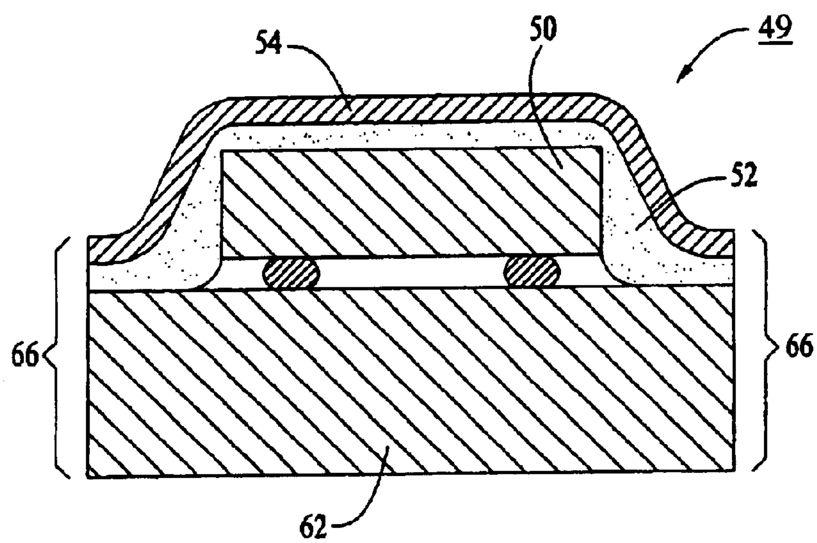
FIG. 7 is a side view, pictorial schematic diagram of a ceramic filter including a top metal layer that has been scribed using the method of the present invention.

Further, multi-layer ceramic components, such as MLCCs including a copper layer, can be scribed using the method of the present invention without destroying the integrity of the other layers. In one embodiment, the green layers of a ceramic filter 49 may be stacked and then the resulting ceramic filter structure may be fired. As shown in FIG. 7, ceramic filter 49 may include a chip 50 that is coated with a laminate 52 and a copper hermetic coating 54. Chip 50 sits atop a ceramic substrate 62. Prior art methods of mechanically sawing through copper hermetic coating 54 unacceptably damaged laminate 52. Also, due to the ductile nature of copper, mechanically sawing the top layer was unacceptably slow. The method of the present invention allows copper hermetic layer 54 of ceramic filter 49 to be cut with a UV laser beam having an energy and spot size sufficient to singulate copper hermetic coating 54 and ceramic substrate 62 without damaging laminate 52. The UV laser used in connection with the method of the present invention may be programmed to cut through copper hermetic coating 54 and to leave in ceramic substrate 62 a trench having a snap line along which ceramic substrate 62 may be singulated into separate, nominally identical circuit components. Alternatively, the UV laser used in connection with the method of the present invention may be programmed to cut through copper hermetic coating 54 without affecting ceramic substrate 62. The laser may then be reprogrammed to have an energy and spot size sufficient to form a scribe line in accordance with the method of the present invention along which ceramic substrate 62 may be singulated into separate, nominally identical circuit components.

Lastly, ceramic substrates having metal-laden streets extending along either, or both, of the x- and y-axis may similarly be singulated using the method of the present invention.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of forming in a ceramic substrate a scribe line that facilitates breakage of the ceramic substrate into separate pieces having side margins defined by the scribe line, the ceramic substrate having a thickness and a surface on or an interior in which is formed a pattern of multiple, mutually spaced apart passive electronic circuit components, the passive electronic circuit components separated by streets along which the scribe line is formed such that the separate pieces created by breakage of the ceramic substrate comprise separate passive electronic circuit components, the method comprising:

aligning an ultraviolet laser beam characterized by an energy and a spot size with one of the streets on the surface of the ceramic substrate;

imparting relative motion between the ultraviolet laser beam and the ceramic substrate such that the laser beam is directed lengthwise along the street and effects depthwise removal of ceramic substrate material to form a shallow trench, the energy and spot size of the ultraviolet laser beam effecting the depthwise removal in the absence of appreciable melting of the ceramic substrate material so that the trench formed in the ceramic substrate material has a width that converges from the surface to a trench bottom in the form of a sharp snap line; and the shape of the trench forming a region of high stress concentration extending into the thickness of the ceramic substrate and along the snap line to effect, in response to a breakage force applied to either side of the trench, clean breakage of the ceramic substrate into separate passive electronic circuit components having side margins defined by the snap line.

2. The method of claim 1, in which the passive electronic circuit components are selected from the group consisting essentially of resistors and capacitors.

3. The method of claim 1, in which a cross-section of the trench is of generally triangular-shape.

4. The method of claim 1, in which the laser beam has a sufficiently short wavelength and a pulse energy that cooperate to minimize resolidification of the ceramic substrate along the sidewalls of the trench.

5. The method of claim 1, in which the snap line is formed at a depth that does not appreciably penetrate the ceramic substrate thickness, thereby minimizing the formation of microcracks extending perpendicular to the scribe line formed in the ceramic substrate piece.

6. The method of claim 5, in which the depth is between about 5% and about 25% of the ceramic substrate thickness.

7. The method of claim 1, in which the laser beam has a wavelength of less than about 400 nm.

8. The method of claim 1, in which multiple scribe lines are formed in the ceramic substrate.

9. The method of claim 1, in which the laser beam has an energy per pulse of between about 50 uJ and about 1000 uJ.

10. The method of claim 1, in which the scribe line is formed by a single pass of the laser beam.

11. The method of claim 1, in which the scribe line is formed by multiple passes of the laser beam.

12. The method of claim 1, in which the laser beam is emitted by a laser operating at a repetition rate of between about 15 kHz and about 100 kHz.

13. The method of claim 1, in which the laser beam is emitted by a laser operating at a power of between about 0.5 W and about 10 W.

14. The method of claim 1, in which the trench has a width that is less than about 30 microns.

15. The method of claim 1, in which the ceramic substrate has an upper surface and a lower surface and one of upper and lower surfaces has printed on it a pattern that facilitates the alignment of the street and the ultraviolet laser beam as it moves lengthwise down the street.

16. A method of forming in a ceramic substrate a scribe line that facilitates breakage of the ceramic substrate into separate pieces having side margins defined by the scribe line, the ceramic substrate having a thickness and a surface on or an interior in which is formed a pattern of multiple, mutually spaced apart electronic circuit components, the electronic circuit components separated by streets along which the scribe line is formed such that the separate pieces created by breakage of the ceramic substrate comprise separate electronic circuit components, the method comprising:

aligning an ultraviolet laser beam characterized by primarily a $TEM_{00}$ spatial mode profile, an energy, and a spot size with one of the streets on the surface of the ceramic substrate;

imparting relative motion between the ultraviolet laser beam and the ceramic substrate such that the laser beam is directed lengthwise along the street and effects depthwise removal of ceramic substrate material to form a shallow trench, the energy and spot size of the ultraviolet laser beam with primarily a $TEM_{00}$ spatial mode profile effecting the depthwise removal in the absence of appreciable melting of the ceramic substrate material so that the trench formed in the ceramic substrate material has a width that converges from the surface to a trench bottom in the form of a sharp snap line at a depth that is between about 5% and about 25% of the ceramic substrate thickness; and the shape of the trench forming a region of high stress concentration extending into the thickness of the ceramic substrate and along the snap line to effect, in response to a breakage force applied to either side of the trench, clean breakage of the ceramic substrate into separate circuit components having side margins defined by the snap line.

17. The method of claim 16, in which the laser beam has an energy per pulse of between about 50 uJ and about 1000 uJ.

18. The method of claim 16, in which the scribe line is formed by a single pass of the laser beam.

19. The method of claim 16, in which the scribe line is formed by multiple passes of the laser beam.

20. The method of claim 16, in which the laser beam is emitted by a laser operating at a repetition rate of between about 15 kHz and about 100 kHz.

21. The method of claim 16, in which the laser beam is emitted by a laser operating at a power of between about 0.5 W and about 10 W.

22. The method of claim 16, in which the trench has a width that is less than about 30 microns.

23. The method of claim 16, in which the ceramic substrate has an upper surface and a lower surface and one of the upper and lower surfaces is at least partly coated with a layer of metal, and in which the laser effects depthwise removal of at least some of the layer of metal.

24. The method of claim 23, in which the metal layer is copper.

25. The method of claim 16, in which the ceramic substrate includes first and second opposite side margins, and in which the streets intersect the first and second opposite margins at oblique angles.

26. A method of forming in a ceramic substrate a scribe line that facilitates breakage of the ceramic substrate into separate pieces having side margins defined by the scribe line, the ceramic substrate having a thickness and upper and lower surfaces, one of which surfaces is at least partly coated with a layer of metal, and the ceramic substrate having in its interior or on one of the upper and lower surfaces a pattern of multiple, mutually spaced apart electronic circuit components, the electronic circuit components separated by streets along which the scribe line is formed such that the separate pieces created by breakage of the ceramic substrate comprise separate electronic circuit components, the method comprising:

aligning an ultraviolet laser beam characterized by an energy and a spot size with one of the streets on the surface of the ceramic substrate;

imparting relative motion between the ultraviolet laser beam and the ceramic substrate such that the laser beam is directed lengthwise along the street and effects depthwise removal of ceramic substrate material and at least some of the layer of metal to form a shallow trench, the energy and spot size of the ultraviolet laser beam effecting the depthwise removal in the absence of appreciable melting of the ceramic substrate material so that the trench formed in the ceramic substrate material has a width that converges from the surface to a trench bottom in the form of a sharp snap line; and the shape of the trench forming a region of high stress concentration extending into the thickness of the ceramic substrate and along the snap line to effect, in response to a breakage force applied to either side of the trench, clean breakage of the ceramic substrate into separate electronic circuit components having side margins defined by the snap line.

27. The method of claim 26, in which the layer of metal includes metal-laden streets.

28. The method of claim 26, in which the energy and spot size characterizing the laser beam includes two sets of values, the first set of values effecting the removal of at least some of the layer of metal and the second set of values effecting the removal of ceramic substrate material.

29. The method of claim 26, in which the metal layer is copper.

30. The method of claim 26, in which the electronic circuit component includes a ceramic filter.

31. The method of claim 30, in which the ceramic filter comprises a laminate and a metal coating, and in which the energy and spot size of the laser beam are sufficient to singulate the metal coating and the ceramic substrate without damaging the laminate.

32. A method of forming in a ceramic substrate a scribe line that facilitates breakage of the ceramic substrate into separate pieces having side margins defined by the scribe line, the ceramic substrate having first and second opposite side margins, a thickness, and a surface on or an interior in which is formed a pattern of multiple, mutually spaced apart electronic circuit components, the electronic circuit components separated by streets along which the scribe line is formed such that the separate pieces created by breakage of the ceramic substrate comprise separate electronic circuit components, the method comprising:

aligning an ultraviolet laser beam characterized by an energy and a spot size with one of the streets on the surface of the ceramic substrate;

imparting relative motion between the ultraviolet laser beam and the ceramic substrate such that the laser beam is directed lengthwise along the street to intersect the first and second opposite side margins at oblique angles and effects depthwise removal of ceramic substrate material to form a shallow trench, the energy and spot size of the ultraviolet laser beam effecting the depthwise removal in the absence of appreciable melting of the ceramic substrate material so that the trench formed in the ceramic substrate material has a width that converges from the surface to a trench bottom in the form of a sharp snap line; and the shape of the trench forming a region of high stress concentration extending into the thickness of the ceramic substrate and along the snap line to effect, in response to a breakage force applied to either side of the trench, clean breakage of the ceramic substrate into separate electronic circuit components having side margins defined by the snap line.

33. The method of claim 32, in which the ceramic substrate is of generally rectangular shape.

34. The method of claim 32, in which at least one of the streets includes a metal layer.

* * * * *